(12) United States Patent
Holmer et al.

(10) Patent No.: US 6,242,368 B1
(45) Date of Patent: *Jun. 5, 2001

(54) REMOVAL OF CARBON FROM SUBSTRATE SURFACE

(75) Inventors: Arthur Edward Holmer, Lewiston; Michael Mark Litwin, Cheektowaga, both of NY (US); Kevin Bruce Albaugh, McKinney, TX (US)

(73) Assignee: Praxair Technology, Inc., Danbury, CT (US)

(*) Notice: Subject to any disclaimer, the term of this patent is extended or adjusted under 35 U.S.C. 154(b) by 0 days.

This patent is subject to a terminal disclaimer.

(21) Appl. No.: 09/434,307

(22) Filed: Nov. 5, 1999

Related U.S. Application Data

(63) Continuation of application No. 08/625,673, filed on Mar. 29, 1996, now Pat. No. 5,998,305.

(51) Int. Cl.$^7$ .................................................. H01L 21/306
(52) U.S. Cl. .......................................... 438/795; 438/906
(58) Field of Search ................................... 438/477, 471, 438/906, 974, 795, 690, 691, 725; 150/643; 134/2, 3, 30, 39, 1.3

(56) References Cited

U.S. PATENT DOCUMENTS

| | | | |
|---|---|---|---|
| 4,028,135 | 6/1977 | Vig et al. | 134/1 |
| 5,024,968 | 6/1991 | Engelsberg | 437/173 |
| 5,099,557 | 3/1992 | Engelsberg | 29/25.01 |
| 5,114,834 | 5/1992 | Nachshoa | 30/9 |
| 5,151,135 | 9/1992 | Magee et al. | 34/1 |
| 5,236,512 | 8/1993 | Rogers et al. | 34/1 |
| 5,254,176 | 10/1993 | Ibuka et al. | 34/2 |
| 5,298,112 | 3/1994 | Saka et al. | 156/643 |
| 5,326,426 | 7/1994 | Tam et al. | 56/643 |
| 5,443,942 | 8/1995 | Kaisha | 30/329 |
| 5,465,154 | 11/1995 | Levy | 56/382 |
| 5,554,257 | 9/1996 | Yokogawa et al. | 156/643.1 |
| 5,578,133 | 11/1996 | Sugino et al. | 134/2 |
| 5,669,979 | 9/1997 | Elliott et al. | 134/1 |

FOREIGN PATENT DOCUMENTS

| | | | |
|---|---|---|---|
| 5307437 | 11/1993 | (JP) . | |
| 07037807 | 2/1995 | (JP) . | |
| WO9507152 | 3/1995 | (WO) | B08B/3/00 |

OTHER PUBLICATIONS

R. Srinivasan, B. Braren, and R. W. Dreyfus, "Ultraviolet laser ablation of polyimide films", *J. Appl. Phys.* 61(1), Jan. 1, 1987.

Audrey C. Engelsberg, Analysis Of Wet Chemical And Water Consumption Costs Versus A Non–Reactive Dry Gas–Phase Cleaning Technology, *Proceedings—Institute of Environmental Sciences*, pp. 254–260.

Werner Kern, "Science, Technology, and Applications", *Handbook of Semiconductor Wafer Cleaning Technology*.

H.D. Gibbs, "The Production of Hydrochloric Acid from Chlorine and Water", *The Journal of Industrial and Engineering Chemistry*, pp. 538–541.

A. C. Engelsbert, "A Dry Laser–Assisted Process For The Removal Of Surface Contamination", *Proceedings—Institute of Environmental Sciences*.

*Primary Examiner*—Savitri Mulpuri
(74) *Attorney, Agent, or Firm*—Bernard Lau

(57) ABSTRACT

The invention is a method of removing materials such as carbon and metallic elements from a substrate surface via heating in an atmosphere of molecular chlorine and steam. In a preferred embodiment, carbon residue is removed from the surface of a Si or GaAs substrate material.

9 Claims, 1 Drawing Sheet

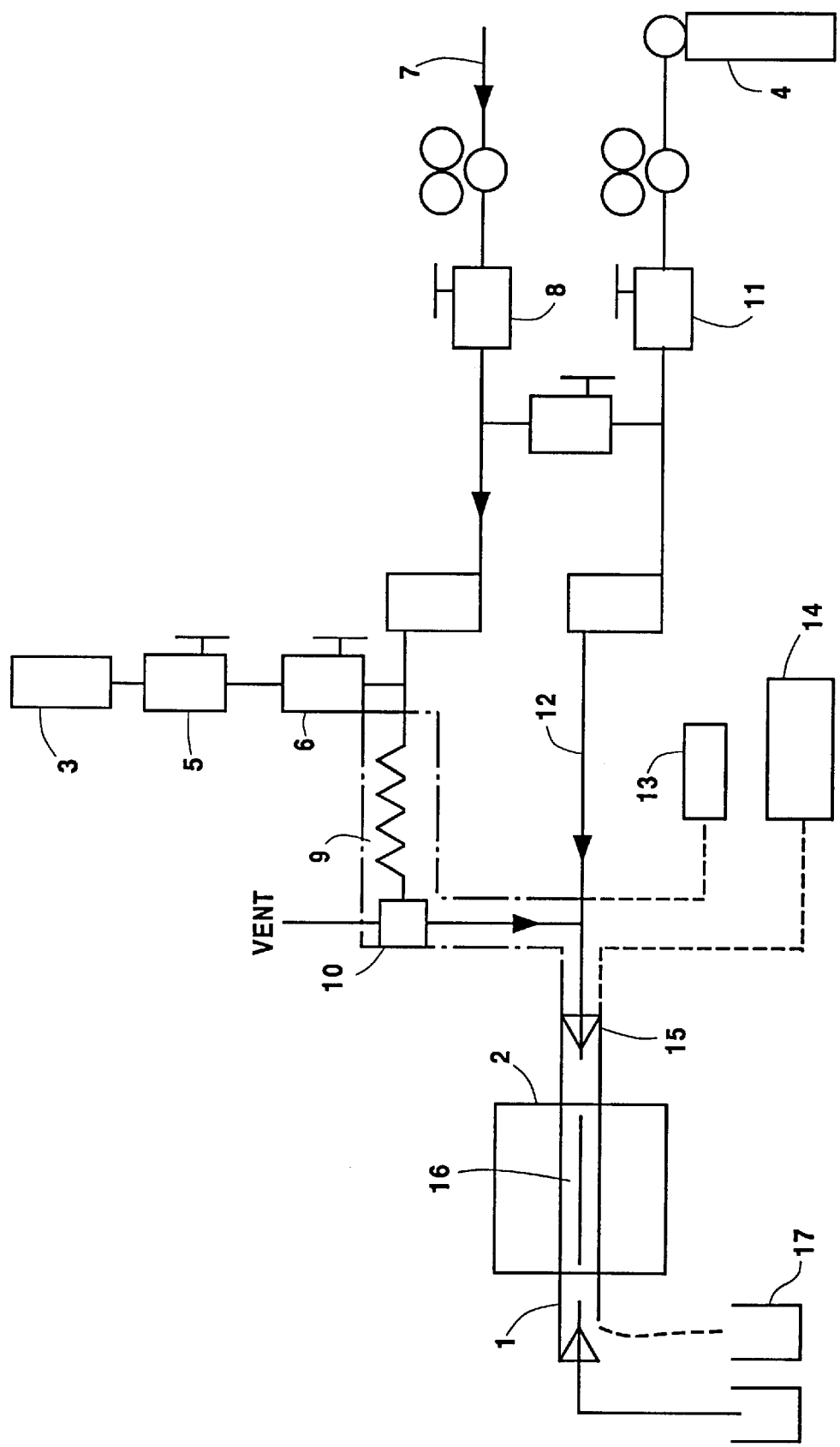

REMOVAL OF CARBON FROM SUBSTRATE SURFACE

This is a Continuation of prior U.S. application Ser. No. 08/625,673 filed on Mar. 29, 1996 now U.S. Pat. No. 5,998,305.

FIELD OF THE INVENTION

The present invention relates to removing carbon from substrate surfaces. More particularly, the invention relates to a method by which this may be accomplished, whereby a steam-chlorine gas thermal cleaning process is used.

BACKGROUND

The current method of semiconductor device fabrication involves the use of a light sensitive polymer known as photoresist. A layer of the photoresist material is spun onto a semiconductor substrate surface at a thickness of about 1 micron (10,000Å) and a patterned exposure performed through a previously prepared photomask. The wafer is then developed as in normal photography. After developing, the unexposed areas of photoresist are washed from the surface leaving selected areas of the wafer exposed or covered, depending on the intent of the fabricator. The wafer is now ready for a process step, such as the bombardment of the surface with boron ions to introduce a doping atom into the silicon wafer to change electrical properties. After this process step is completed, the developed areas of photoresist must be removed to allow the sequence to be repeated with a different pattern.

The current semiconductor industry standard stripping and cleaning method involves the use of at least three liquid chemical solutions known as "SPM", "SC-1" and "SC-2", in use since 1970. "SPM" stands for "sulfuric acid peroxide mix," and "SC" stands for "standard clean". SPM is a solution of concentrated sulfuric acid and 30% hydrogen peroxide, and is used to remove heavy organics, such as photoresist. SC-1 is a solution of 29 wt/wt % ammonium hydroxide, 30% hydrogen peroxide and deionized water. It is used at approximately 70° C. to 80° C. to oxidize surface organic films and remove some metal ions. SC-2 is a final rinse solution of 37 wt/wt % hydrochloric acid and 30% hydrogen peroxide and deionized water. It is used at approximately 75° C. to 80° C. These solutions were first developed at the RCA corporation during the 1960's and are sometimes known as "RCA cleans". This approach may be accomplished at temperatures less than 100° C., which is an important consideration as uncontrolled dopant diffusion in the wafer itself will occur if temperatures of approximately 150° C. to 200° C. are reached for any extended period of time.

The liquid process is deficient in that safety, environmental considerations of disposal and water availability are major drawbacks. In addition, a more important limitation comes from the inherent surface tension of these materials. The liquids have difficulty in entering features smaller than approximately 0.3 micrometers. Finally, the liquid process is relatively time consuming because there is a drying step required to remove the liquid cleaning agents. This results in low throughput. As device and feature size continue to decrease in size, new methods of stripping and cleaning must be found.

The most straightforward approach to dealing with the problems associated with liquid cleaning is to develop gas phase methods. Gases are easier to dispose of by scrubbing, have less volume, do not require a drying step and do not have the same surface tension drawbacks. This approach is known as "dry cleaning".

Initially, gas phase methods similar to those used to remove contaminants such as dust were applied. These techniques use applied thermal or UV energy for contaminant excitation in an air, oxygen or inert gas atmosphere. (See U.S. Pat. Nos. 5,024,968; 5,099,557 to Engelsberg). Unfortunately, these systems lack sufficient energy to remove photoresist or very heavy contamination.

This problem was partially solved by the use of various excimer laser photoresist stripping processes such as those disclosed in U.S. Pat. No. 5,114,834 to Nachshon, and in WO9507152 to Elliott et al. Nachshon teaches the application of a laser at an angle perpendicular to the semiconductor surface to remove photoresist via ablation. A reactive gas, such as oxygen or ozone may be provided to react with the ablated material. Elliott teaches the application of a laser at an angle which is preferably 15° to the semiconductor surface to remove feature edges of photoresist via ablation. It is recommended that two applications should be used, wherein the disc is rotated 90° between the first and second. As with Nachshon, a reactive gas such as oxygen or ozone may be provided to react with the ablated material.

These processes are deficient however, in that they leave a residue of carbon on the wafer surface which is on the order of 100Å to 200Å in depth (for a 1; micron photoresist layer). Srinivasan et al (J. Appl. Phys. 61(1) January, 1987) teach that the source of the carbon does not appear to be from redeposition of partially combusted ablated carbon, but from a type of ashing process produced from the instantaneous high (>1000 K) temperatures and pressures (>100 atm) of the laser itself. This residue must be reduced to a thickness of less than about 4 Å before the next fabrication step can be performed. Attempts to remove the carbon residue with a UV light and ozone treatment have not been successful in part because the UV laser light is absorbed by the ozone. In addition, metallic contaminant residues, such as Al or Fe may also result from the semiconductor fabrication processes. Activated chlorine gas has been used to remove these residues, but this results in damage to the wafer.

OBJECTS OF THE INVENTION

It is therefore an object of the invention to develop a process that removes undesired carbon materials from a substrate surface without altering said substrate the surface of the semiconductor substrate. This process should be low temperature (less than or equal to 200° C.) and also be strictly gas phase.

It is a further object of the invention to provide a process whereby such carbon residues may be removed to an extent such that the next fabrication step in semiconductor device manufacture is possible.

SUMMARY OF THE INVENTION

Our invention is a method which removes carbon materials from a substrate surface. This method comprises heating said substrate in an atmosphere of steam and molecular chlorine gas.

In preferred embodiments, the heating is at a temperature of less than 200° C., and the steam and molecular chlorine gas are in a ratio of approximately 12:1 in said atmosphere.

In another preferred embodiment, the carbon removal treatment is combined with a photoresist laser ablation step in order to provide a method for the removal of photoresist from substrate materials.

BRIEF DESCRIPTION OF THE DRAWING

Other objects, features and advantages will occur to those skilled in the art from the following description of preferred embodiments and the accompanying drawing, in which:

FIG. 1 shows an apparatus which is used to remove carbon residue which remains after the application of the laser in the stripping process.

DETAILED DESCRIPTION OF THE INVENTION

The invention is a treatment of a Si or GaAs wafer which has been stripped of photoresist via laser ablation. As stated above, present laser stripping processes are ineffective in that they leave a carbon layer having a thickness of more than about 100 Å on the surface of the substrate. The thickness of this layer must be reduced to an extent such that further device fabrication is possible. Thus any carbon remaining must be at a level such that it cannot be detected by SIMS analysis (e.g. the carbon must be at or below the "background" level of approximately 4 Å). The process we have developed accomplishes this result, and involves heating the wafer in an atmosphere of steam and molecular chlorine gas.

Our process uses the following chemical reaction:

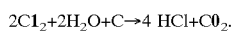

$2Cl_2 + 2H_2O + C \rightarrow 4 HCl + CO_2$.

This gas phase reaction is remarkable and critical to the process because of its ability to remove a layer of carbon at a rate of about 1–2 Å per minute at temperatures below 200° C. If the reaction is run at higher temperatures, the substrate materials are etched by the chlorine.

The reaction is carried out on wafers that have been stripped of their photoresist by laser ablation. The process may be used to remove a carbon residue of any thickness up to about a micron, the only limitation being the time. The process may be carried out in one of two ways.

In the first method, the reaction is carried out in the laser stripping apparatus. In this case, a mixture of humidified argon is blended with molecular chlorine and delivered to the gas reaction box. Many difficulties were encountered which involved corrosion within in the apparatus, as the reaction chamber cannot be heated and gaseous HCl was formed from a photochemically induced side reaction between the steam and chlorine.

In the second method, the reaction is carried out in a specially modified thermal furnace, the details of which are shown in FIG. 1. As shown in the figure, quartz tube 1 is placed in Lindberg furnace 2 which is ultimately connected to a water source 3 and a chlorine gas source 4. The furnace is shielded to external light sources as stray UV light may result in the formation of gaseous HCl. The general process will now be described.

A controlled amount of deionized water flows from the reservoir 3 through valve 5 to three-way needle valve 6. At this point it is mixed with an inert carrier gas (nitrogen) provided from source 7, and flow controlled via valve 8. The water is vaporized in stainless steel coil 9 and carried via the carrier gas via three-way valve 10 for blending with an amount of chlorine gas from source 4 which has been measured via valve 11. The blending occurs in line 12 which should be Teflon® so as to prevent corrosion. The use of the three-way valve 11 is beneficial for three reasons. First, it allows for the confirmation of steam generation; second, it controls the application of steam to the wafer treating process; and third, it allows for uninterrupted steam generation when changing sample wafers.

Prior to mixing with the steam, the chlorine gas is heated to prevent condensation. This is controlled via temperature monitor 13 and VARIAC current controller 14.

The combined water-vapor/molecular chlorine gas stream 15 is introduced into the quartz tube 1 to treat the wafer 16. Post treatment condensate 17 is drained away from the wafer to avoid contamination. The primary advantage of this apparatus is that it is far cheaper and easier to maintain than the laser stripping unit described in the first method.

The steam-chlorine reaction should be run at a temperature which is greater than 100° C. and less than 200° C. At temperatures of 100° C. and below the steam will condense to a liquid phase which will damage the wafer. As noted earlier, at temperatures greater than 200° C., there may be diffusion of ion dopants (such as B or As) into the substrate.

A molar ratio of 12:1 of steam to molecular chlorine at a flow rate of 1 standard liter per minute is most preferred as this was found to give optimal results. Other ratios between 1:1 and 15:1 may be used, but all result in lower reaction rates which simultaneously extend process time and potentially increases the amount of substrate etching that occurs. As such these are less desirable. The 12:1 ratio is optimal as we found that a large excess of water was required for the reaction to proceed at a reasonable rate such that 1–2 Å/min. of carbon are removed. Further, at ratios in excess of 12:1, the chlorine was diluted to such an extent that processing time was unacceptable.

Also, while the most preferred flow rate is about one standard liter per minute, slower flow rates may be used. These are less desirable because they increase removal time. Faster flow rates of up to 20 standard liters per minute do increase the removal rate to some degree, but are more difficult to sustain.

Our most preferred conditions are:
Temperature: 110–200° C., preferably 150° C.
Blend: 1:1 to 15:1, preferably 12:1 (molar) steam: chlorine
Flow: 100–30,000 cc/min, preferably 1200 cc/min steam
50–1500 cc/min, preferably 100 cc/min chlorine
50–1000 cc/min, preferably 50 cc/min
carrier ($N_2$)
Rate of removal of C: about 1–2 Å/min.

The carrier gas is used to facilitate the movement of steam through the furnace, and may be any gas which is inert to the steam/chlorine reaction, such as $N_2$, Ar or air.

It should be noted that other possible applications of this reaction include the intentional etching or surface preparation of wafers that have graphite SiC or diamond layers as well as substrates consisting entirely of those materials. In these applications the temperature of the reaction is not limited to the optimum range discussed above. The reaction is used to remove carbon from the substrate materials so as to etch the substrate. In addition, the process may be used in the removal from a substrate of trace contaminant elements such as Al or Fe, resulting from semiconductor device processing.

Specific features of the invention are shown in one or more of the drawings for convenience only, as each feature may be combined with other features in accordance with the invention. Alternative embodiments will be recognized by those skilled in the art and are intended to be included within the scope of the claims.

What is claimed is:

1. A method of etching the surface of a SiC, graphite or diamond substrate, said method comprising heating said surface in the absence of UV light in an atmosphere of steam and molecular chlorine gas to remove carbon.

2. A method of removing photoresist from the surface of a substrate, said method comprising the steps of:

a) applying a laser beam to said surface such that photoresist is ablated from said surface and a carbon residue remains; then
b) removing sold carbon from said surface via heating said wafer in the absence of UV light in an atmosphere of steam and molecular chlorine gas.

3. The method of claim 2, wherein said substrate is heated to a temperature of less than 200° C.

4. The method of claim 2, wherein said substrate is heated to a temperature of more than 100° C.

5. The method of claim 2, wherein said substrate is heated to a temperature of 150° C.

6. The method of claim 2, wherein said steam and molecular chlorine gas are in a molar ratio of approximately 1:1 to 15:1 in said atmosphere.

7. The method of claim 2, wherein said steam and molecular chlorine gas are in a ratio of approximately 12:1 in said atmosphere.

8. The method of claim 2, wherein said heating takes place in a furnace.

9. The method of claim 2, wherein the substrate is selected from the group consisting of Si and GaAs.

* * * * *